United States Patent
Wollesen

(12) 
(10) Patent No.: US 6,201,761 B1
(45) Date of Patent: Mar. 13, 2001

(54) FIELD EFFECT TRANSISTOR WITH CONTROLLED BODY BIAS

(75) Inventor: Donald L. Wollesen, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/491,823

(22) Filed: Jan. 26, 2000

(51) Int. Cl.[7] ........................................ G11C 7/02
(52) U.S. Cl. .............. 365/233; 365/185.29; 365/185.33; 365/181
(58) Field of Search ................... 365/51, 185.33, 365/189.01, 176, 181, 185.29

(56) References Cited

U.S. PATENT DOCUMENTS

| | | |
|---|---|---|
| 5,047,979 | * 9/1991 | Leung .................. 365/189.01 |
| 5,804,856 | 9/1998 | Ju . |
| 5,811,855 | 9/1998 | Tyson et al. . |
| 5,825,696 | 10/1998 | Hidaka et al. . |
| 5,846,857 | 12/1998 | Ju . |
| 5,877,046 | 3/1999 | Yu et al. . |
| 5,879,975 | 3/1999 | Karlsson et al. . |
| 5,894,152 | 4/1999 | Jaso et al. . |

* cited by examiner

Primary Examiner—Terrell W. Fears
(74) Attorney, Agent, or Firm—Renner, Otto, Boisselle & Sklar LLP

(57) ABSTRACT

A field effect transistor (FET) is formed on a silicon on insulator (SOI) substrate in the thin silicon layer above the insulating buried oxide layer. A clock signal defines a clock period with an active portion and a wait portion. The source region and/or the drain region are coupled to a body pumping signal. The body pumping signal includes a negative voltage pulse occurring during the wait portion which sets the voltage of a body region of the FET to a preset voltage during such negative voltage pulse. Decay of the preset voltage is predictable such that operation of the FET can be controlled during the active portion.

20 Claims, 3 Drawing Sheets

FIELD EFFECT TRANSISTOR WITH CONTROLLED BODY BIAS

TECHNICAL FIELD

The present invention generally relates to the design of field effect transistors (FETs) using silicon-on-insulator (SOI) technology and, more particularly, to FETs with controlled body bias.

BACKGROUND OF THE INVENTION

Conventional or bulk semiconductor devices are formed in semiconductive material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid undesired short circuits. A relatively large amount of surface area is needed for the electrical isolation of the various transistors. This is undesirable for the current industry goals for size reduction. Additionally, junction capacitance between the source/drain and the bulk substrate increase power consumption, require higher threshold voltages, and slows the speed at which a device using such transistors can operate (e.g. degrades frequency response). These problems result in difficulties in reducing the size, power consumption, and voltage of CMOS technology devices.

In order to deal with the junction capacitance problem and improve frequency response, silicon on insulator technology (SOI) has been gaining popularity. A SOI wafer is formed from a bulk silicon wafer by using conventional oxygen implantation or bonded wafer techniques to create a buried oxide layer at a predetermined depth below the surface. The implanted oxygen oxidizes the silicon into insulating silicon dioxide in a guassian distribution pattern centered at the predetermined depth to form the buried oxide layer.

An SOI field effect transistor comprises two separated impurity regions consisting of the source and drain regions of the transistor of a first semiconductor conductivity and a channel region between them of the opposite semiconductor conductivity covered by a thin gate insulator and a conductive gate. In operation, a current can flow between the source and drain through the channel region when the channel region is depleted by applying a voltage in excess of the threshold voltage to the conductive gate. A problem with SOI FET's is that the channel region between the source and drain is electrically floating because the source and drain regions normally extend entirely through the thin silicon layer to the buried oxide insulating layer. This effect is known as the floating body effect and can cause instability and unpredictable operation because the floating body potential affects the FET threshold voltage and affects the current flow through the FET for a particular gate voltage.

For example, referring to FIG. 1, it can be seen that a conventional N-channel (P-type) SOI FET 10 includes a lightly doped P-type conductivity body region 12 and an N-type source region 14 and drain region 16. A source/body junction 32 and a drain/body junction 34 are on opposing sides of the body region 12. The source region 14 and the drain region 16 extend entirely from the surface to the buried oxide layer 24 such that the body region 12 is entirely isolated from the silicon substrate 26. A gate oxide 18 and polysilicon gate 20 define the FET channel region channel 22 across the body region 12 between the source region 14 and the drain region 16.

In operation of FET 10, when gate electrode 28 is pulled high, free electron carriers 30 accumulate in the channel region 22 below the gate oxide 18 which enables free electron current flow across the channel between the source 14 and the drain 16. When the gate electrode is low, the channel region 22 depletes and a reverse biased junction at the source/body junction 32 and at the drain/body junction 34 exists. The reverse biased junctions prevent current flow between the source region 14 and the drain region 16.

Because of reverse bias current leakage across the source/body junction 32 and/or across the drain/body junction 34, the body region 12 may charge to a positive potential, up to Vdd, in some cases, by the accumulation of holes in the channel region. This charge accumulation is unpredictable and it makes operation of the FET unpredictable because charge accumulation effects: (1) current leakage between the source region 12 and drain region 16 across the junctions when the FET 10 is turned "OFF"; (2) transient bipolar current flows from the source region 14 to the drain region 16 when the FET 10 is turned "OFF"; (3) the current flow across the channel region 22 when a Vdd potential is applied to the gate electrode to turn the FET "ON"; and (4) the rate at which such current flow "ramps up" when the FET 10 is turned on.

Such unpredictability effects are particularly problematic for FETs used in static random access memory SRAM cells and other devices where it is critical that the FET threshold voltage remain controlled to control operating speed, access time, and or OFF state drain current.

Accordingly, there is a strong need in the art for a semiconductor field effect transistor structure, and a method for forming such structure, that includes the low junction capacitance characteristics of the SOI FET but does not suffer the disadvantages of being unpredictable due to the floating body effect.

SUMMARY OF THE INVENTION

A first object of this invention is to provide a silicon-on-insulator logic circuit with controlled field effect transistor body potential, comprising: a) a silicon-on-insulator substrate with a silicon device layer separated from a base substrate by an insulating layer; b) a field effect transistor formed in the silicon device layer including a source region and a drain region both of a first semiconductor conductivity, a gate electrode defining an electrically isolated central channel region of the opposite semiconductor conductivity between the source region and the drain region; c) a clock signal defining a clock period with an active portion and a wait portion; and d) a charge pump voltage signal comprising a negative voltage pulse dropping the signal potential of the charge pump signal to a pump potential and occurring during a portion of the wait portion of the clock period and coupled to at least one of the source region and drain region to drop the potential of such at least one of the source region and the drain region to the pump potential during the negative voltage pulse to create a forward bias junction between the at least one of a source region and drain region and the body region to drop the potential in the body region to a preset potential.

In a first embodiment, a switch may further be included coupled between the at least one of the source region and the drain region and the charge pump voltage signal and driven by the clock signal to isolate the at least one of the source region and the drain region from the charge pump signal during the active portion of the clock period. Preferably, the field effect transistor operates in a voltage range between a ground voltage and a first positive voltage and the signal potential is approximately ground voltage and the pump potential is less than ground, such as five volts less than ground.

In a second embodiment, a capacitor may further be included and coupled between the at least one of the source region and the drain region and the charge pump voltage signal. Preferably, the field effect transistor operates in a voltage range between a ground voltage and a first positive voltage and the signal potential is a positive voltage and the pump potential is approximately ground. The field effect transistor and the capacitor may comprise a dynamic memory cell.

A second objective of the present invention is to provide a method of controlling the floating body potential of a silicon on insulator field effect transistor, the method comprising: a) generating a clock signal to define a clock period with an active portion and a wait portion; and (b) coupling at least one of a source region and a drain region of said field effect transistor to a body pumping voltage pulse during a portion of the wait portion to create a forward biased junction between a body region of said field effect transistor and the at least one of the source region and the drain region to sink a body potential to a known potential during the portion of the wait portion.

In a first embodiment, the body pumping voltage pulse may be a voltage pulse in a body pumping signal and the method may further include isolating the at least one of a source region and a drain region from the body pumping signal during the active portion. The field effect transistor may operate in a voltage range between a ground voltage and a first positive voltage and the body pumping voltage signal potential is approximately ground voltage and the body pumping voltage pulse is less than ground, such as five volts less than ground.

In a second embodiment, the body pumping voltage pulse may be a voltage pulse in a body pumping signal and the method may further include capacitivelly coupling the at least one of a source region and a drain region to the body pumping signal during the active portion. The field effect transistor may operate in a voltage range between a ground voltage and a first positive voltage and the body pumping signal potential is a positive voltage and the body pumping pulse potential is approximately ground. The field effect transistor and a capacitor forming the capacitive coupling may form a dynamic memory cell.

DESCRIPTION OF THE PREFERRED EMBODIMENTS

Figure 1:
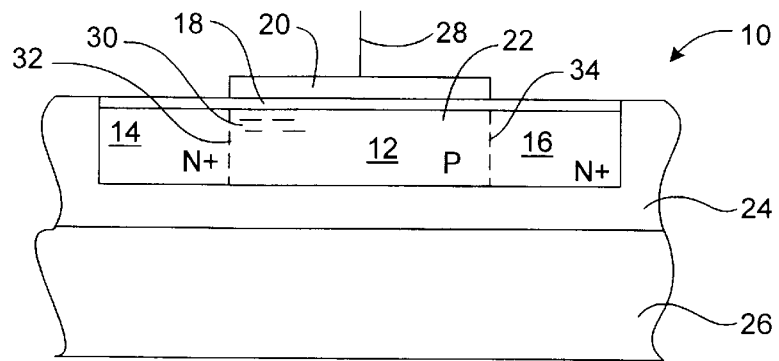
FIG. 1 is a cross sectional diagram of a reference silicon on insulator field effect transistor structure.

The present invention will now be described in detail with reference to the drawings. In the drawings, like reference numerals are used to refer to like elements throughout. Although the exemplary embodiment is shown with respect to an N-channel FET structure, those skilled in the art will readily appreciate that the teachings of this invention are applicable to P-channel FETs also.

Figure 2:
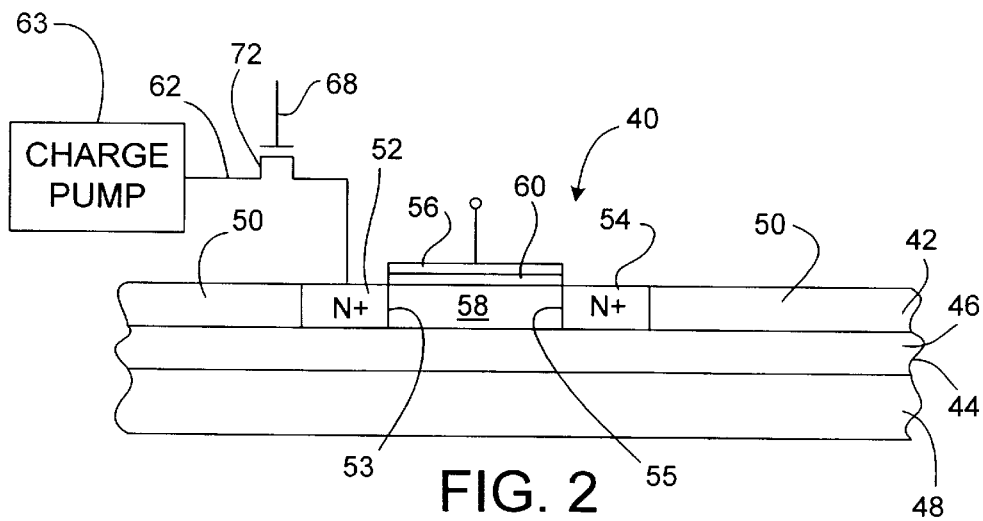
FIG. 2 is a cross sectional diagram of a silicon on insulator field effect transistor in accordance a first embodiment of this invention.

Referring to FIG. 2, an N-channel FET 40 is shown formed in a silicon device layer 42 of a SOI wafer 44. An insulating buried oxide layer 46 separates the silicon device layer 42 from a base substrate 48. The FET 40 is isolated from other devices (not shown) formed in the silicon device layer 42 by insulating trench regions 50.

FET 40 comprises an N-conductivity source region 52 and an N-conductivity drain region 54. A gate electrode 56 defines a p-conductivity channel region 58. A gate insulating layer 60 isolates the gate electrode 56 from the channel region 58.

Figure 3:
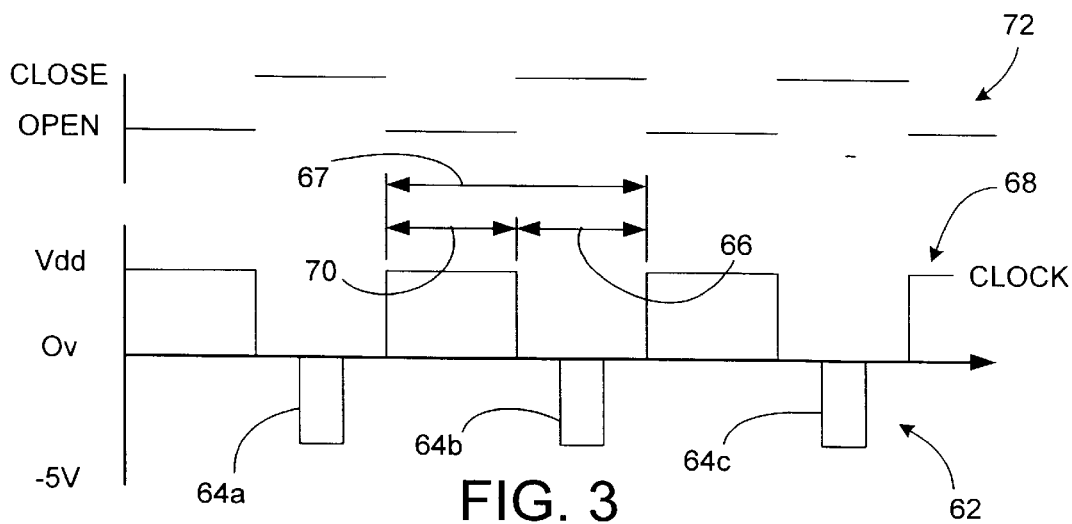
FIG. 3 is a clock cycle timing diagram showing operation of a portion of a charge pumping circuit in accordance with one embodiment of this invention.

The source region 52 is coupled to a charge pumping signal 62 from a charge pump 63 through a switch 72 which is driven by a clock signal 68. Referring to FIG. 3, clock signal 68 cycles between a high logic state (e.g. Vdd) and a low logic state (e.g. ground) defining a clock period 67 with the high logic state portion being an active portion 70 and the low logic state being a wait portion 66. Switch 72 is open during the active portion 70 and is closed during the wait portion 66 of the clock period 67. The charge pump signal 62 is a sequence of negative voltage pulses 64(a)–(c), each of which occurs during a wait portion 66 of clock period 67. In the preferred embodiment, the clock period 67 is on the order of 10 u seconds and the negative voltage pulses 64 have a very short period in the order of 1 nano second or approximately 1% or less of, and centered in, the wait portion 66 of clock period 67.

Referring again to the diagram of FIG. 2 and to the clock cycle diagram of FIG. 3, in operation, the switch 72 isolates the source region 52 from the charge pump signal 62 from charge pump 63 during the active portion 70 of the clock period 67 such that charge pump signal 62 has no effect on normal operation of FET 40 during the active portion 70 of the clock period 67. However, when the clock signal 68 is low, switch 72 is closed and the charge pump signal 62 is coupled to the source region 52. During the wait portion 66 of each clock period 67, a negative voltage pulse 64 is coupled to the source region 52. As such, the potential of source region 52 is pulled down to the negative pulse potential, which for this exemplary example may be a voltage less than ground potential such as −5V. Such negative potential in the source region 52 causes a forward bias across the semiconductor junction 53 between the source region 52 and the body region 58 which rapidly sinks the potential of the body region 58 to a preset potential. The preset potential will not be the same potential as the source region 52 because junction capacitance causes a voltage drop across the semiconductor junction 53. However, the preset voltage will be within one multiple of the junction voltage drop of the source region 52 potential. For example, if the voltage pulse is −5V, the source region 52 potential will sink to −5V and assuming a 0.5V drop across the semiconductor junction 53, the preset voltage will be 4.5V.

At the end of the negative voltage pulse 64, the source region 52 will return to ground potential creating a reverse bias across semiconductor junction 53 between the body region 58 and the source region 52 and a reverse bias semiconductor junction 55 between the drain region 54 and the body region 58 such that the body region 58 remains at the preset potential. While it is known that current will leak across such reverse bias semiconductor junctions 53 and 55 to decay the preset potential of the body region 58 during the remainder of the wait portion 66 and the active portion 70 of the clock period 67, the time varying decay of such preset potential can be calculated and/or empirically measured such that the operation of FET 40 during the active portion 70 of the clock period 68 can be predictably controlled.

Figure 4:
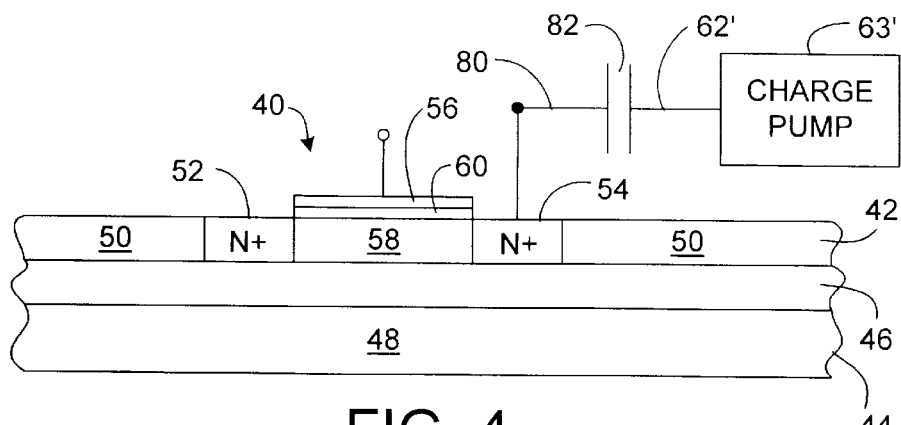
FIG. 4 is a cross sectional diagram of a silicon on insulator field effect transistor in accordance a second embodiment of this invention.

Referring to FIG. 4, a second embodiment of this invention is shown. Similar to the first embodiment, an N-channel FET 40 is shown formed in a silicon device layer 42 of a SOI wafer 44. An insulating buried oxide layer 46 separates the silicon device layer 42 from a base substrate 48. The FET 40 is isolated from other devices (not shown) formed in the silicon device layer 42 by insulating trench regions 50.

FET 40 comprises an N-conductivity source region 52 and an N-conductivity drain region 54. A gate electrode 56 defines a p-conductivity channel region 58. A gate insulating layer 60 isolates the gate electrode 56 from the channel region 58. The drain region 54 of FET 40 is coupled to a node 80 which is coupled to charge pump signal 62' from charge pump 63' through a capacitor 82. It should be appreciated that in this configuration node 80 may be a memory node for a DRAM memory cell which comprises node 80, capacitor 82, and FET 40.

Figure 5:
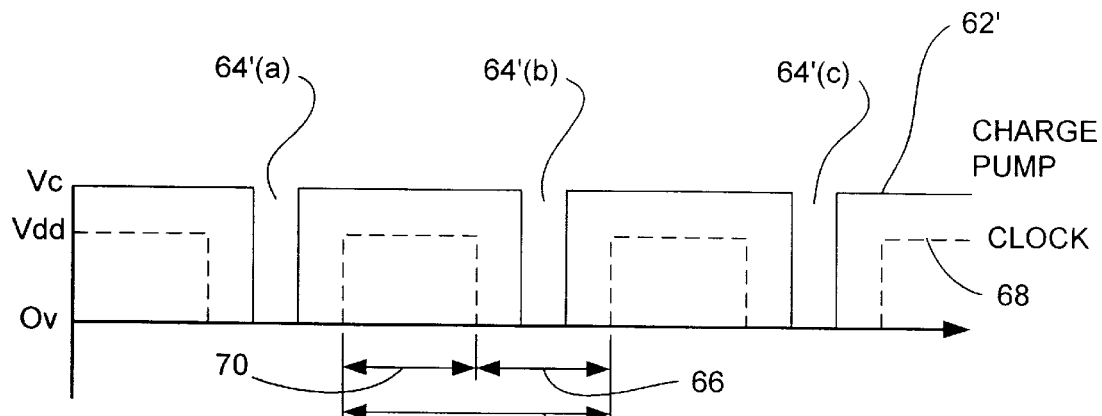
FIG. 5 is a clock cycle timing diagram showing operation of a portion of a charge pumping circuit in accordance with one embodiment of this invention.

Referring to FIG. 5, clock signal 68 cycles between a high logic state and a low logic state defining a clock period 67 with the high logic state portion being an active portion 70 and the low logic state being a wait portion 66. The charge pump signal 62' is a sequence of negative voltage pulses 64'(a)–(c), each of which occurs during a wait portion 66 of clock period 67. Each negative voltage pulse 64' drops the voltage of charge pump signal 62' from Vc potential to ground for the duration of the negative voltage pulse 64'. In the preferred embodiment Vc is 5V, each negative voltage pulse 64' drops the voltage of charge pump signal 62' from Vc to ground potential, the clock period 67 is on the order of 10u seconds and the negative voltage pulses 64' have a period of approximately 1% of the wait portion 66 of clock period 67.

Referring again to the diagram of FIG. 4 and to the clock cycle diagram of FIG. 5, while charge pump signal 62' is at Vc potential during the active portion 70 of clock period 67, a charge can be stored on node 80 and capacitor 82 while the FET 40 is in the off state (e.g. gate electrode 56 is at ground potential). During the wait portion 66 of the clock period 67, the negative voltage pulse 64 on the charge pump signal 62' causes a current pulse through capacitor 82 in accordance with the equation:

$$\text{Current} = \text{Capacitive Constant} \times \frac{(d \text{ Voltage})}{(d \text{ Time})}.$$

This current pulse depletes the charge on node 80 and pulls the potential of node 80 and the drain region 54 to a potential on the order of −5V. When the drain region 54 is pulled to such negative potential, a forward bias across the semiconductor junction 55 between the drain region 54 and the body region 58 exists which rapidly sinks the potential of the body region 58 to a preset potential. Again, the present potential will not be the same potential as the drain region 54 because junction capacitance causes a voltage drop across the semiconductor junction 55. However, the preset potential will be within one multiple of the potential drain region 54.

At the end of the negative voltage pulse 64 charge pump signal 62' returns to Vc again creating a current pulse through capacitor 82 which restores the charge originally stored at node 80. The drain region 54 will also return to the stored charge potential creating a reverse bias semiconductor junction 55 between the body region 58 and drain region 54 such that the body region 58 remains at the preset potential. Again, while it is known that current will leak across such reverse bias junction 55 to decay the preset charge in the body region 58 during the remainder of the wait portion 66 and during the active portion 70 of the clock period 67. the time varying decay of such preset charge can be calculated and/or empirically measured such that the operation of FET 40 during the active state can be predictably controlled.

Figure 6:
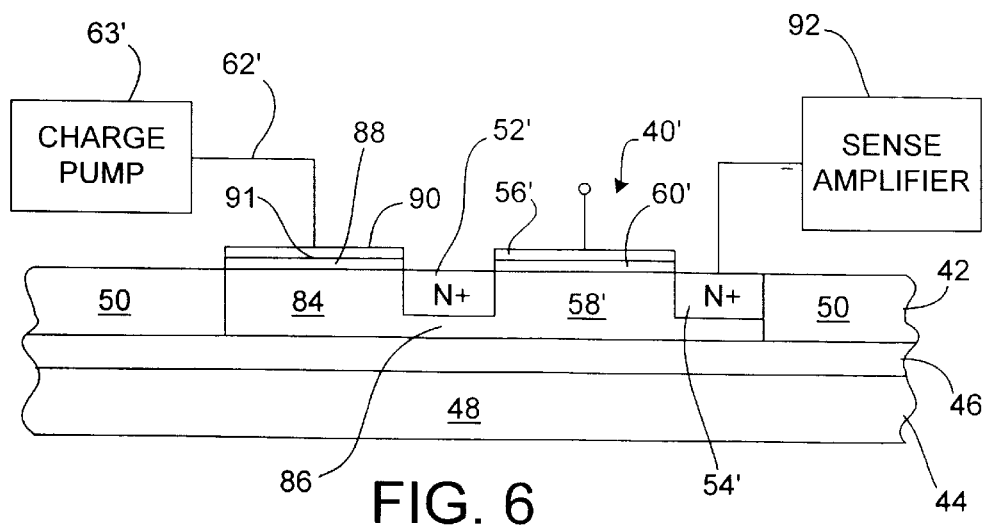
FIG. 6 is a cross sectional diagram of a silicon on insulator field effect transistor in accordance a third embodiment of this invention.

Referring to FIG. 6, yet a third embodiment of the present invention is shown. An N-channel FET 40' is shown formed in a silicon device layer 42 of a SOI wafer 44. An insulating buried oxide layer 46 separates the silicon device layer 42 from a base substrate 48. The FET 40' is isolated from other devices (not shown) formed in the silicon device layer 42 by insulating trench regions 50.

FET 40' comprises an N-conductivity source region 52', and an N-conductivity drain region 54', neither of which extend entirely to the insulating buried oxide layer 46. A gate electrode 56' defines a p-conductivity channel region 58'. A gate insulating layer 60' isolates the gate electrode 56' from the channel region 58'. A P-conductivity enhancement region 84 is coupled to the channel region 58' by a p-conductivity region 86 beneath the source region 52'. An insulating layer 88 and a polysilicon capacitor plate 90 are on top of the enhancement region forming capacitor 91. It should be appreciated that the insulator layer 88 can be simultaneously formed with gate insulating layer 60' and that capacitor plate 90 can be simultaneously formed with gate electrode 56'.

Referring to the diagram of FIG. 6 and to the clock cycle diagram of FIG. 5, capacitor plate 90 is coupled to charge pumping signal 62' from charge pump 63'. In operation, while charge pumping signal 62' is at Vc potential, a charge is stored at capacitor 91 (e.g. capacitive coupling between the capacitor plate 90 and the enhancement region 84 causes an accumulation of electron carriers in the enhancement region 84). When charge pumping signal 62' drops to ground potential during negative voltage pulses 64', the a current pulse through the capacitor 91, again described by:

$$\text{Current} = \text{Capacitive Constant} \times \frac{(d \text{ Voltage})}{(d \text{ Time})}$$

causes the charge in the enhancement region to deplete and pulls the enhancement region 84 and the body region 58' to a potential on the order of −5V. At the end of the negative voltage pulse 64' charge pump signal 62' returns to Vc again creating a current pulse through the capacitor 91 which restores the charge originally stored in capacitor 91. While holes will again accumulate in the body region 58', during the remainder of the wait portion 66 and during the active portion 70 of the clock period 67, the time varying accumulation of such holes can be calculated and/or empirically measured such that the operation of FET 40' during the active state can be predictably controlled.

It should be appreciated that the structure of FIG. 6, can also function as a dynamic memory cell. By coupling drain region 54' to a sense amplifier 92, and by letting source region 52' float, source region 52' becomes capacitively coupled to capacitor plate 90 thorough enhancement region 84. In operation, applying a positive voltage (e.g. Vdd) to the gate 56' to turn FET 40' on, will result in coupling the charge stored in floating source region 52' to drain region 54'.

Figure 7:
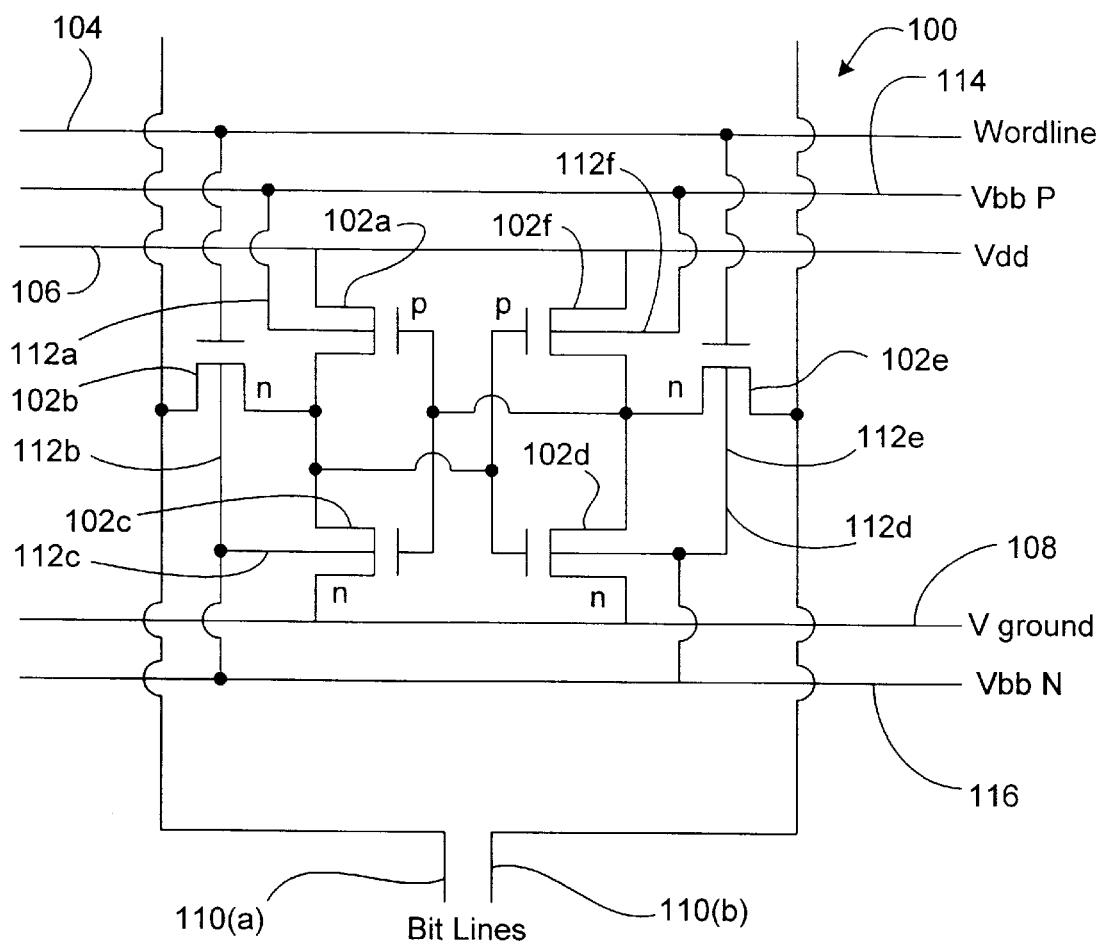
FIG. 7 is a circuit diagram of an SRAM cell in accordance with one embodiment of this invention.

Referring to FIG. 7, a static random access memory SRAM cell structure 100 is shown in accordance with one embodiment of this invention. SRAM cell structure 100 includes six FETs 102(*a*)–(*f*) interconnected in a known 6T-SRAM structure between a word line 104, a Vdd line 106, a Vground line 108, and bit lines 110(*a*)–(*b*).

Additionally, each of FETs 102(*a*)–(*f*) include a corresponding body tie circuit 112(*a*)–(*f*), each of which functions to couple the channel region of the FET 102 to which the body tie circuit 112 corresponds to a body bias voltage line 114 or 116. More specifically, the channel of each P-channel FET 102(*a*) and (*f*) are coupled to P-Channel body bias voltage 114 and the channel of each N-channel FET 102(*b*), (*c*), (*d*), and (*e*) are coupled to an N-channel body bias voltage 116. It should be appreciated that the body tie circuits 112 are shown structured as conductive paths between the channel of FET 102 and an appropriate body bias voltage 114 or 116, however, the body charge pumping structures and methods discusses with reference to FIGS. 2–6 can as readily be used to couple the channel of each FET 102 to the appropriate body bias voltage 114 or 116.

It should also be appreciated that for high speed, high performance SRAM designs, it is often necessary to use low threshold FETs in order to get higher gain and thus higher operating speed. Or faster access time in the case of an SRAM. Unfortunately, if FET threshold voltage, Vt, is reduced to a voltage much below 0.5 volts, then the standby drain current increases from the Pico-Ampere level to as much as many Nano-Amperes. In a large SRAM array, the standby current will be the number of cells involved times the off current of a typical cell. For a 1 Megabit SRAM, that would be a million times the off current of the typical cell and the array leakage will typically be well in excess of 1 milli-Ampere per Megabit of SRAM memory.

If a negative body bias reference is used selectively for N Channel transistors and a positive body bias reference is used selectively for P Channel transistors, the transistors in the array can be "reverse biased" when not in use in order to minimize standby current. When the SRAM array needs to be operated (read or write), then the transistors may be activated with a more positive body bias for N Channel transistors and a more negative bias for P Channel transistors which will increase standby current but will also increase the speed of the SRAM array.

Figure 8:
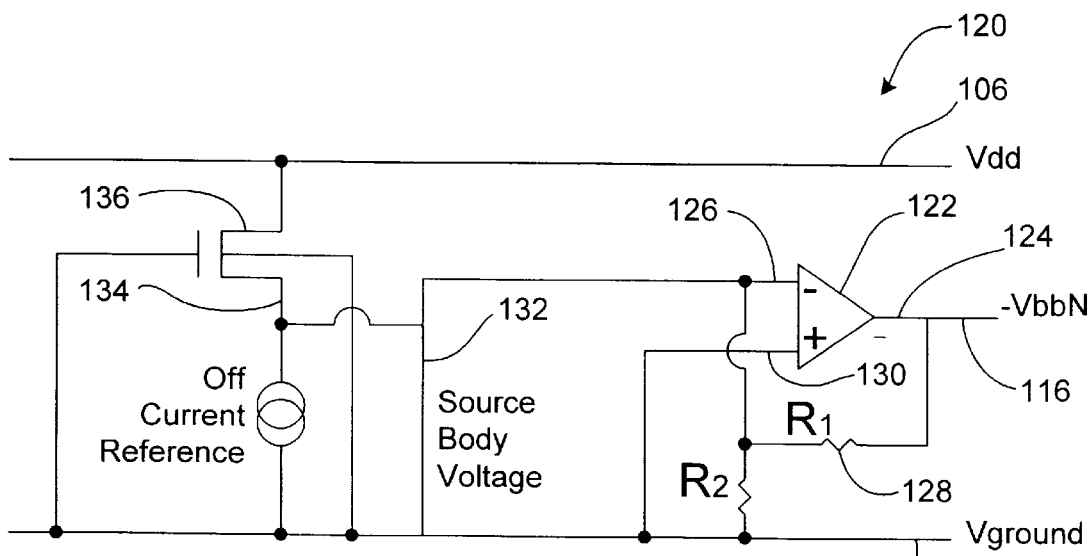
FIG. 8 is a circuit diagram of a body bias control circuit in accordance with one embodiment of this invention.

Referring to FIG. 8, an exemplary body bias regulation circuit 120 for regulating the N-channel body bias voltage 116 is shown. The output 124 of an inverting amplifier 122 provides the N-channel body bias voltage 116. The output 124 is also fed back to the negative input 126 of inverting amplifier 122 through a first resistor 128. A positive input 130 of inverting amplifier 122 is coupled to Vground 108. The negative input 126 is also coupled in parallel to a source body voltage reference potential 132 and an off current reference potential 134. A FET 136 couples the negative input 126 to Vdd 106.

It should be appreciated that the teachings of this invention provide for a SOI FET with controlled and predictable operation during the active portion of a clock period. Although the invention has been shown and described with respect to certain preferred embodiments, it is obvious that equivalents and modifications will occur to others skilled in the art upon the reading and understanding of the specification. For example, the described embodiment relates to an N-Channel FET while those skilled in the art will readily be able to apply the teachings of this invention to a P-Channel FET. The present invention includes all such equivalents and modifications, and is limited only by the scope of the following claims.

What is claimed is:

1. A silicon-on-insulator logic circuit with controlled field effect transistor body potential, comprising:

a) a silicon-on-insulator substrate with a silicon device layer separated from a base substrate by an insulating layer;

b) a field effect transistor formed in the silicon device layer including a source region and a drain region both of a first semiconductor conductivity, a gate electrode defining an electrically isolated central channel region of the opposite semiconductor conductivity between the source region and the drain region;

c) a clock signal defining a clock period with an active portion and a wait portion; and d) a charge pump voltage signal comprising a negative voltage pulse dropping the signal potential of the charge pump signal to a pump potential and occurring during a portion of the wait portion of the clock period and coupled to at least one of the source region and drain region to drop the potential of such at least one of the source region and the drain region to the pump potential during the negative voltage pulse to create a forward bias junction between the at least one of a source region and drain region and the body region to drop the potential in the body region to a preset potential.

2. The silicon-on-insulator logic circuit with controlled field effect transistor body potential of claim 1, further including a switch coupled between the at least one of the source region and the drain region and the charge pump voltage signal and driven by the clock signal to isolate the at least one of the source region and the drain region from the charge pump signal during the active portion of the clock period.

3. The silicon-on-insulator logic circuit with controlled field effect transistor body potential of claim 2, wherein the field effect transistor operates in a voltage range between a ground voltage and a first positive voltage and the signal potential is approximately ground voltage and the pump potential is less than ground.

4. The silicon-on-insulator logic circuit with controlled field effect transistor body potential of claim 2, wherein the pump potential is approximately five volts less than ground potential.

5. The silicon-on-insulator logic circuit with controlled field effect transistor body potential of claim 1, further including a capacitor coupled between the at least one of the source region and the drain region and the charge pump voltage signal.

6. The silicon-on-insulator logic circuit with controlled field effect transistor body potential of claim 5, wherein the field effect transistor operates in a voltage range between a ground voltage and a first positive voltage and the signal potential is a positive voltage and the pump potential is approximately ground.

7. The silicon-on-insulator logic circuit with controlled field effect transistor body potential of claim 6, wherein the field effect transistor and the capacitor comprise a dynamic memory cell.

8. A method of controlling the floating body potential of a silicon on insulator field effect transistor, comprising:

a) generating a clock signal to define a clock period with an active portion and a wait portion; and (b) coupling at least one of a source region and a drain region of said field effect transistor to a body pumping voltage pulse during a portion of the wait portion to create a forward biased junction between a body region of said field effect transistor and the at least one of the source region and the drain region to sink a body potential to a known potential during the portion of the wait portion.

9. The method of controlling the floating body potential of a silicon on insulator field effect transistor of claim 8, wherein the body pumping voltage pulse is a voltage pulse in a body pumping signal and further including isolating the at least one of a source region and a drain region from the body pumping signal during the active portion.

10. The method of controlling the floating body potential of a silicon on insulator field effect transistor of claim 9, wherein the field effect transistor operates in a voltage range between a ground voltage and a first positive voltage and the body pumping voltage signal potential is approximately ground voltage and the body pumping voltage pulse is less than ground.

11. The method of controlling the floating body potential of a silicon on insulator field effect transistor of claim 10, wherein the body pumping voltage pulse potential is approximately five volts less than ground potential.

12. The method of controlling the floating body potential of a silicon on insulator field effect transistor of claim 8, wherein the body pumping voltage pulse is a voltage pulse in a body pumping signal and further includes capacitively coupling the at least one of a source region and a drain region to the body pumping signal during the active portion.

13. The method of controlling the floating body potential of a silicon on insulator field effect transistor of claim 12, wherein the field effect transistor operates in a voltage range between a ground voltage and a first positive voltage and the body pumping signal potential is a positive voltage and the body pumping pulse potential is approximately ground.

14. The method of controlling the floating body potential of a silicon on insulator field effect transistor of claim 13, wherein the field effect transistor and a capacitor forming the capacitive coupling form a dynamic memory cell.

15. A static random access memory cell, comprising:

a) a silicon-on-insulator substrate with a silicon device layer separated from a base substrate by an insulating layer;

b) a plurality of field effect transistor formed in the silicon device layer including a source region and a drain region both of a first semiconductor conductivity, a gate electrode defining an electrically isolated central channel region of the opposite semiconductor conductivity between the source region and the drain region;

c) SRAM circuitry interconnecting the source regions, drain region, and gate electrode of each field effect transistor to form an SRAM cell;

d) a clock signal defining a clock period with an active portion and a wait portion; and d) a charge pump voltage signal comprising a negative voltage pulse dropping the signal potential of the charge pump signal to a pump potential and occurring during a portion of the wait portion of the clock period and coupled to at least one of the source region and drain region of at least one of the field effect transistors to drop the potential of at least one of the source region and the drain region to the pump potential during the negative voltage pulse to create a forward bias junction between the at least one of a source region and drain region and the body region to drop the potential in the body region to a preset potential.

16. The static random access memory cell of claim 15, further including a switch coupled between the at least one of the source region and the drain region and the charge pump voltage signal and driven by the clock signal to isolate the at least one of the source region and the drain region from the charge pump signal during the active portion of the clock period.

17. The static random access memory cell claim 16, wherein the field effect transistor operates in a voltage range between a ground voltage and a first positive voltage and the signal potential is approximately ground voltage and the pump potential is less than ground.

18. The static random access memory cell claim 17, wherein the pump potential is approximately five volts less than ground potential.

19. The static random access memory cell of claim 18, further including a capacitor coupled between the at least one of the source region and the drain region and the charge pump voltage signal.

20. The static random access memory cell of claim 19, wherein the field effect transistor operates in a voltage range between a ground voltage and a first positive voltage and the signal potential is a positive voltage and the pump potential is approximately ground.

* * * * *